(12) United States Patent
Uchida

(10) Patent No.: US 9,035,299 B2
(45) Date of Patent: May 19, 2015

(54) SEMICONDUCTOR DEVICE AND METHOD FOR PRODUCING SAME

(75) Inventor: Seiichi Uchida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 12 days.

(21) Appl. No.: 13/990,701

(22) PCT Filed: Nov. 29, 2011

(86) PCT No.: PCT/JP2011/077492
§ 371 (c)(1),
(2), (4) Date: May 30, 2013

(87) PCT Pub. No.: WO2012/073942
PCT Pub. Date: Jun. 7, 2012

(65) Prior Publication Data
US 2013/0248857 A1 Sep. 26, 2013

(30) Foreign Application Priority Data
Dec. 1, 2010 (JP) .................. 2010-268819

(51) Int. Cl.
*H01L 27/14* (2006.01)
*H01L 27/12* (2006.01)
*G02F 1/1368* (2006.01)

(52) U.S. Cl.
CPC .......... *H01L 27/1225* (2013.01); *G02F 1/1368* (2013.01); *H01L 27/127* (2013.01)

(58) Field of Classification Search
CPC ............ H01L 29/7869; H01L 27/1225; H01L 27/1214; H01L 27/3244; H01L 27/3246; H01L 27/3248

USPC .................. 257/43, 72; 349/42, 43
See application file for complete search history.

(56) References Cited

U.S. PATENT DOCUMENTS

| 7,737,517 B2* | 6/2010 | Kawamura et al. ........... 257/432 |
| 8,242,505 B2* | 8/2012 | Kawamura et al. ............. 257/72 |
| 2008/0035920 A1 | 2/2008 | Takechi et al. |
| 2008/0169469 A1 | 7/2008 | Kawamura et al. |
| 2009/0101895 A1 | 4/2009 | Kawamura et al. |
| 2009/0278131 A1 | 11/2009 | Kwon et al. |

FOREIGN PATENT DOCUMENTS

| JP | S62-133478 A | 6/1987 |
| JP | 63-301989 A | 12/1988 |
| JP | 2004-102151 A | 4/2004 |

(Continued)

OTHER PUBLICATIONS

International Search Report (ISR) issued in PCT/JP2011/077492 mailed in Mar. 2012.

*Primary Examiner* — Minh-Loan Tran
(74) *Attorney, Agent, or Firm* — Chen Yoshimura LLP

(57) ABSTRACT

A TFT substrate (10A), which is semiconductor device of the present invention, has a first substrate (11), and a plurality of TFTs supported by the first substrate (11). Each TFT has an oxide semiconductor layer (22A) supported by the first substrate (11), an insulating layer (32A) formed on the oxide semiconductor layer (22A), a first electrode (12A) formed on the insulating layer (32A), and a second electrode (14A) and a third electrode (13A) connected to the oxide semiconductor layer (22A). The second electrode (14A) and the third electrode (13A) are formed of an oxide conductive layer in which the same oxide semiconductor film as the oxide semiconductor layer (22A) is given a reduced resistance.

5 Claims, 14 Drawing Sheets

(56) References Cited

FOREIGN PATENT DOCUMENTS

| JP | 2008-040343 A | 2/2008 |
| JP | 2008-175842 A | 7/2008 |
| JP | 2009-99887 A | 5/2009 |
| JP | 2009-271527 A | 11/2009 |

* cited by examiner

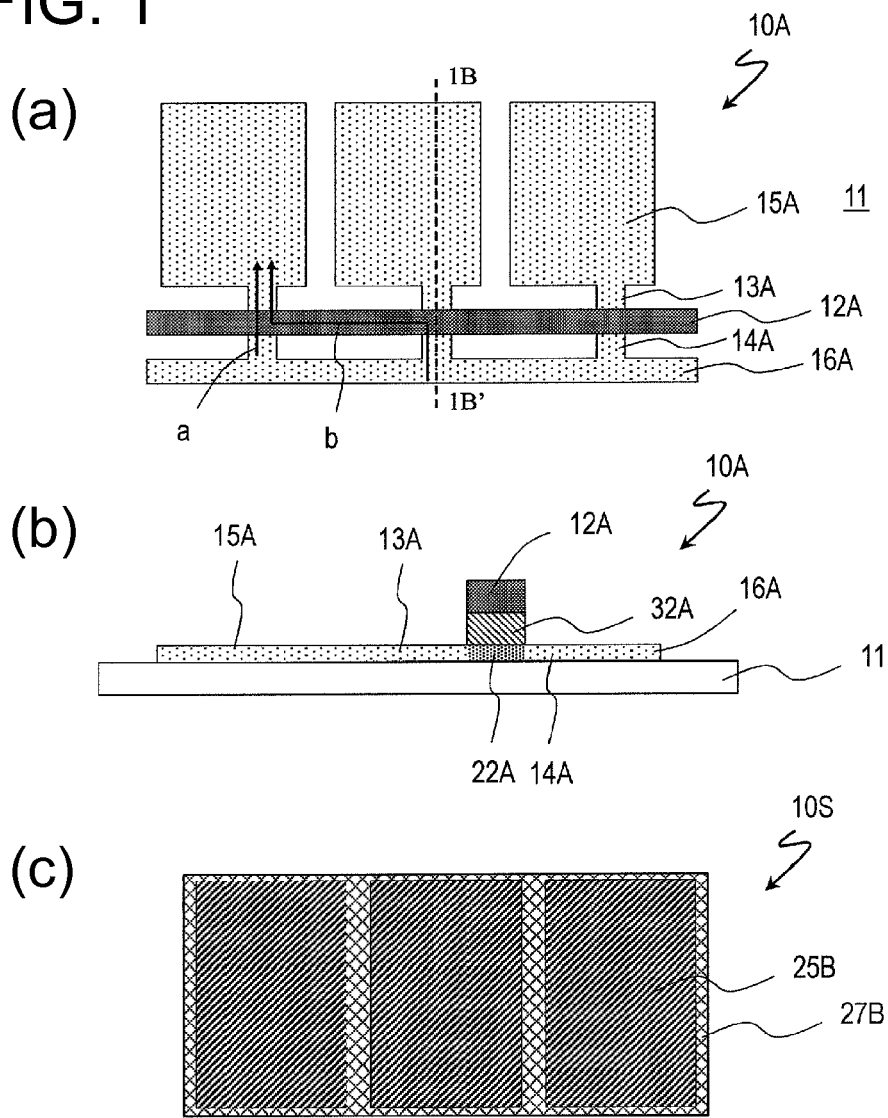
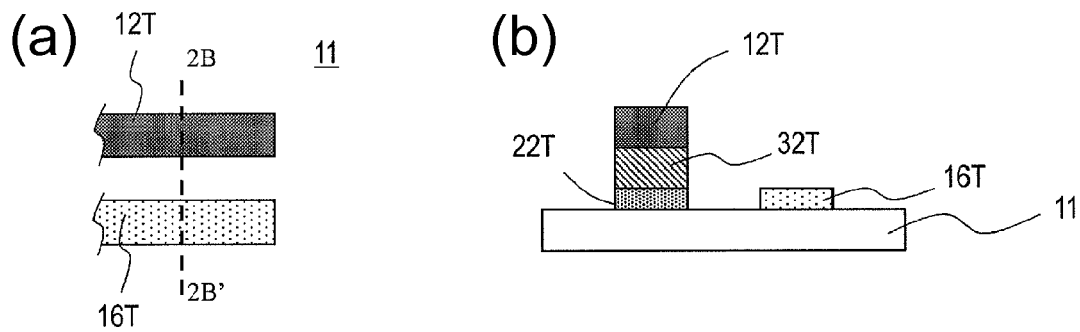

FIG. 5
(a)
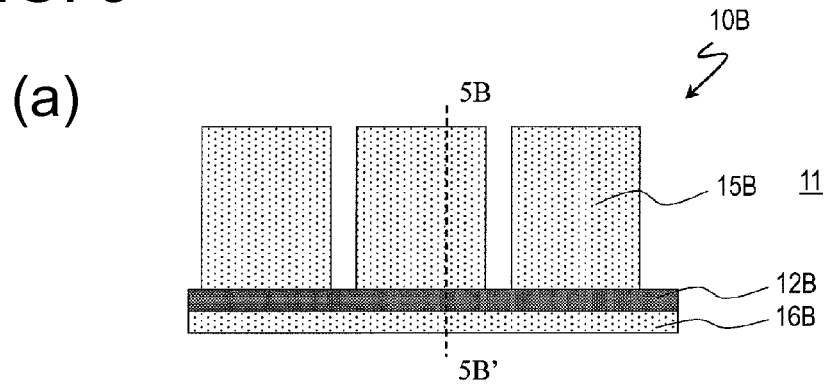
(b)
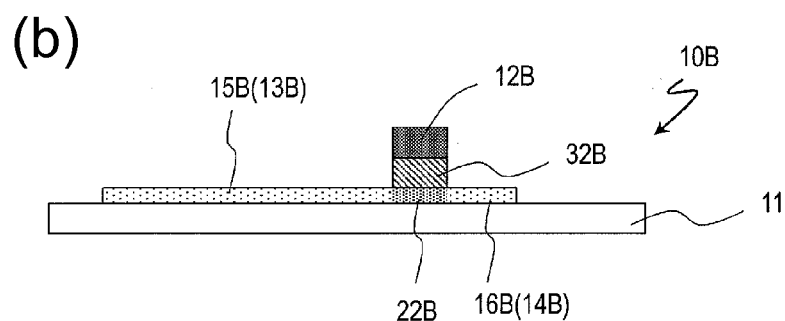
FIG. 6
(a)
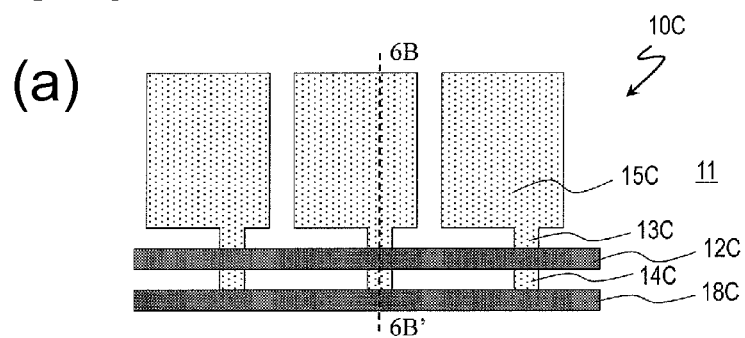
(b)
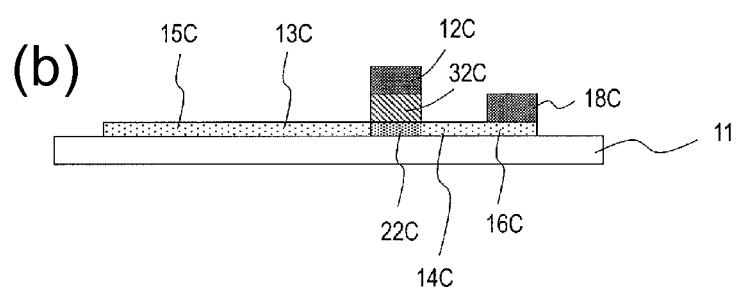

FIG. 12
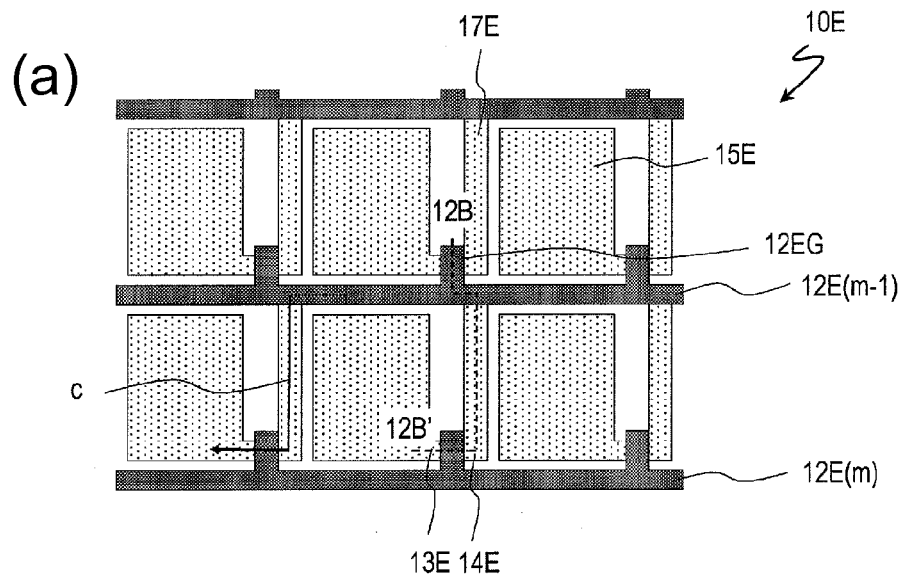
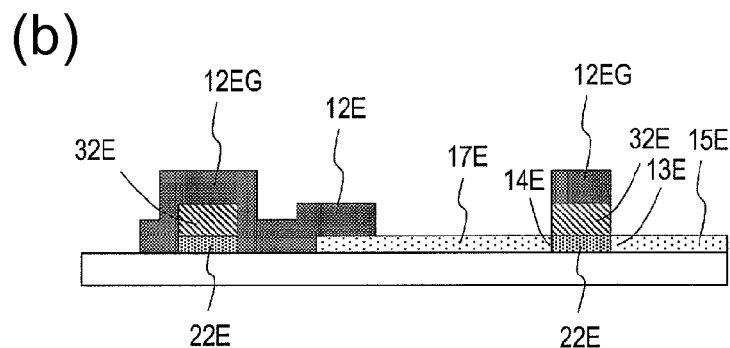
FIG. 13
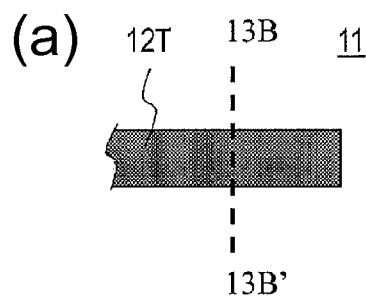
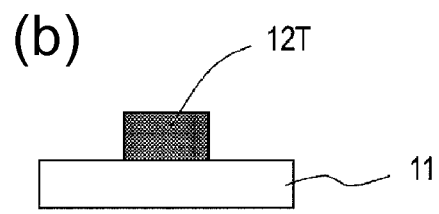

FIG. 17
(a) Prior Art
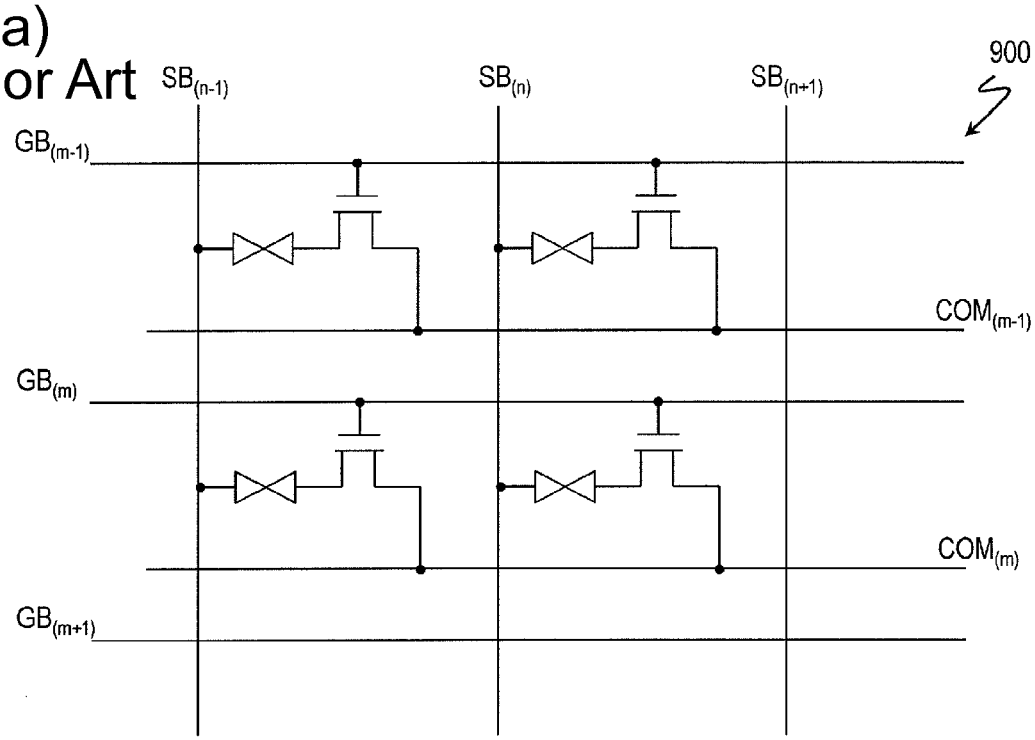
(b) Prior Art
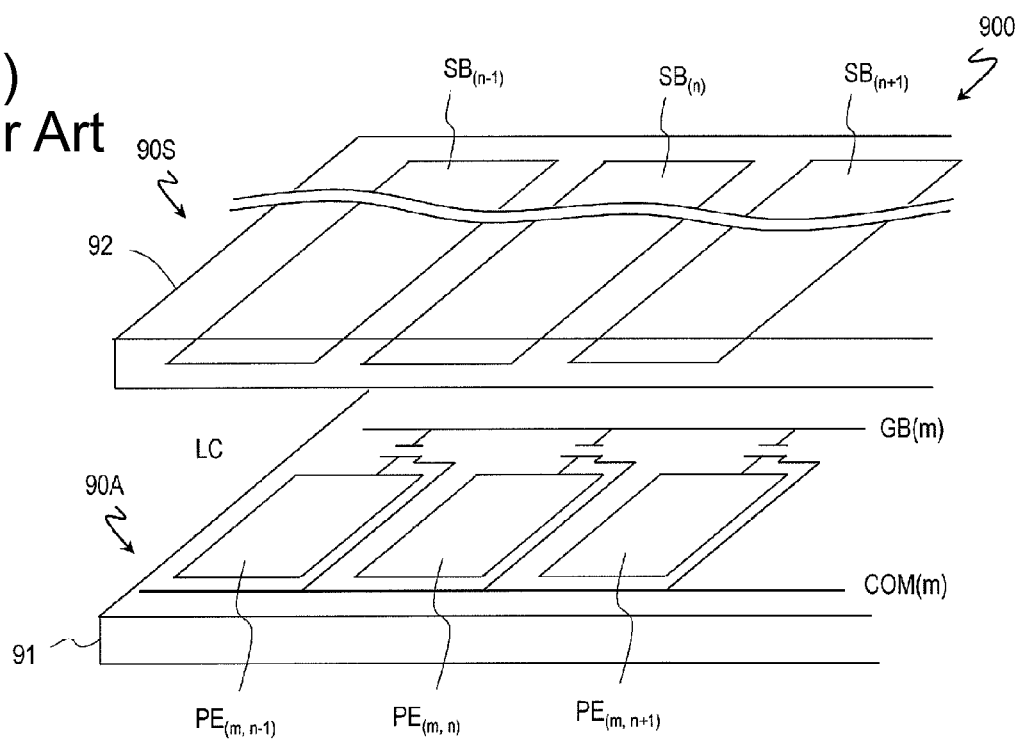

SEMICONDUCTOR DEVICE AND METHOD FOR PRODUCING SAME

TECHNICAL FIELD

The present invention relates to a semiconductor device having oxide semiconductor TFTs, and a manufacturing method therefor. The semiconductor device is a liquid crystal display panel or a TFT substrate used in a liquid crystal display panel, for example.

BACKGROUND ART

Currently, TFT liquid crystal display panels are widely used. In recent years, liquid crystal display panels and organic EL display panels with oxide semiconductor TFTs with a higher mobility than conventional amorphous silicon TFTs are being developed (Patent Document 1, for example).

On the other hand, as liquid crystal display panels become more popular, there is an increasing need for lower prices. Thus, a liquid crystal display panel and a manufacturing method therefor that can reduce the number of photomasks used in photolithography are being developed, for example. Currently, studies are being conducted on reducing the number of photomasks used in a process from five to four or three, for example.

Also, in order to increase the manufacturing yield for TFT liquid crystal display panels, a display panel is proposed in which gate bus lines (also referred to as "scan bus lines") for supplying scanning signal voltages to the gate electrodes of the TFTs, and source bus lines (also referred to as "data bus lines") for supplying display signal voltages to the source electrodes of the TFTs are provided on separate substrates (Patent Document 2, for example). Such a structure for the display panel is sometimes referred to as an "opposite matrix structure" or an "opposite source structure".

FIG. 17(a) shows an equivalent circuit of a conventional liquid crystal display panel 900 having an opposite matrix structure, and FIG. 17(b) is a schematic perspective view of the liquid crystal display panel 900.

The liquid crystal display panel 900 includes a TFT substrate 90A, an opposite substrate 90S, and a liquid crystal layer LC interposed therebetween. The TFT substrate 90A has a substrate 91, and a plurality of pixel electrodes PE formed in a matrix with rows and columns on the liquid crystal layer LC side of the substrate 91. Each pixel electrode PE is connected to the drain electrode of the corresponding TFT, and the source electrode of the TFT is connected to a common wiring line COM. The common wiring lines COM are parallel to gate bus lines GB. The opposite substrate 90S includes a substrate 92, and source bus lines (also referred to as signal wiring lines) SB that are parallel to each other in the column direction, formed on the liquid crystal layer LC side of the substrate 92. It is apparent that the rows and columns are interchangeable, and this is also true for embodiments of the present invention.

RELATED ART DOCUMENTS

Patent Documents

Patent Document 1: Japanese Patent Application Laid-Open Publication No. 2009-99887
Patent Document 2: Japanese Patent Application Laid-Open Publication No. S62-133478

SUMMARY OF THE INVENTION

Problems to be Solved by the Invention

An object of the present invention is to provide a semiconductor device having oxide semiconductor TFTs and a manufacturing method therefor, in which the manufacturing process is simpler than for conventional devices.

Means for Solving the Problems

A semiconductor device according the present invention includes: a first substrate; and a plurality of TFTs supported by the first substrate, wherein each of the plurality of TFTs includes an oxide semiconductor layer supported by the first substrate, an insulating layer provided on the oxide semiconductor layer, a first electrode provided on the insulating layer, and a second electrode and a third electrode connected to the oxide semiconductor layer, and wherein the second electrode and the third electrode are made of an oxide conductive layer that is the same oxide semiconductor film as the oxide semiconductor layer, with a reduced resistance.

In an embodiment, the above-mentioned semiconductor device further includes a plurality of pixel electrodes provided on the first substrate and arranged in a matrix with rows and columns, wherein each of the plurality of pixel electrodes is connected to the third electrode of a TFT corresponding thereto out of the plurality of TFTs, and is made of the oxide conductive layer.

In an embodiment, the above-mentioned semiconductor device further includes a second substrate; and a plurality of signal electrodes supported by the second substrate, wherein each of the plurality of signal electrodes is disposed facing pixel electrodes belonging to one of any column.

In an embodiment, the oxide semiconductor layer and the insulating layer are provided so as to be self-aligned with respect to the first electrode.

In an embodiment, the first electrode of each of the plurality of TFTs corresponding to the pixel electrodes belonging to any row is connected to a common first bus line, the first electrode and the first bus line including a first conductive layer made of the same conductive film, and the second electrode of each of the plurality of TFTs corresponding to the pixel electrodes belonging to any row is connected to a common second bus line, the second bus line including the oxide conductive layer.

In an embodiment, the first bus line includes the first electrode, the second bus line includes the second electrode, each of the pixel electrodes includes the third electrode, and when viewing the first substrate from a normal line direction, no gap is present between the first bus line and the second bus line or between the first bus line and the pixel electrodes.

In an embodiment, the second bus line includes a second conductive layer provided on the oxide conductive layer, the second conductive layer being made of the same conductive film as the first conductive layer.

In an embodiment, the first bus line includes the first electrode, each of the pixel electrodes includes the third electrode, and when viewing the first substrate from the normal line direction, there is no gap between the first bus line and the pixel electrodes, and a gap between the first bus line and the second conductive layer of the second bus line is filled with the oxide conductive layer.

In an embodiment, the first electrode of each of the plurality of TFTs corresponding to the pixel electrodes belonging to any row is connected to a common first bus line, the first electrode and the first bus line including a first conductive layer made of the same conductive film, the semiconductor device further includes a lead-out wiring line extending from the second electrode and connected to the first bus line of an adjacent row, and a common voltage is supplied to the second electrode from the first bus line in the adjacent row.

A manufacturing method for a semiconductor device according the present invention includes: preparing a substrate; forming an oxide semiconductor film, an insulating film, and a conductive film in this order on the substrate; forming a mask on the conductive film by halftone exposure, the mask having a prescribed pattern and having a thick portion that is thicker than another region; forming an oxide semiconductor layer, an insulating layer, and a conductive layer having the prescribed pattern by etching the oxide semiconductor film, the insulating film, and the conductive film using the mask; removing a portion of the mask other than the thick portion; etching the insulating layer and the conductive layer based on a pattern of the thick portion; forming an oxide conductive layer by reducing a resistance of a region of the oxide semiconductor layer where the insulating layer, the conductive layer, and the thick portion are not formed; and removing the thick portion.

Another manufacturing method for a semiconductor device according the present invention includes: preparing a substrate; forming an oxide semiconductor film, and an insulating film in this order on the substrate; forming a first mask on the insulating film by halftone exposure, the first mask having a first pattern and having a thick portion that is thicker than another region; forming an oxide semiconductor layer and an insulating layer having the first pattern by etching the oxide semiconductor film and the insulating film using the first mask; removing a portion of the first mask other than the thick portion; etching the insulating layer based on a pattern of the thick portion; forming an oxide conductive layer by reducing a resistance of a region of the oxide semiconductor layer where the insulating layer and the thick portion are not formed; removing the thick portion; forming a conductive layer covering the oxide semiconductor layer, the oxide conductive layer, and the insulating layer; forming a second mask having a second pattern on the conductive layer; and forming the conductive layer having the second pattern by etching the conductive layer using the second mask.

Effects of the Invention

According to the present invention, a semiconductor device having oxide semiconductor TFTs and a manufacturing method therefor, in which the manufacturing process is simpler than for conventional devices, is provided.

BRIEF DESCRIPTION OF THE DRAWINGS

FIG. 1 is a schematic view that shows a structure of a TFT substrate 10A and an opposite substrate 10S included in a liquid crystal display panel of Embodiment 1 of the present invention. FIG. 1(a) is a plan view of the TFT substrate 10A, FIG. 1(b) is a cross-sectional view of the TFT substrate 10A along the line 1B-1B' in FIG. 1(a), and FIG. 1(c) is a plan view of the opposite substrate 10S.

FIG. 2 shows a structure of terminals of the TFT substrate 10A. FIG. 2(a) is a plan view, and FIG. 2(b) is a cross-sectional view of FIG. 2(a) along the line 2B-2B'.

FIGS. 3(a), 3(c), and 3(e) are plan views, and FIGS. 3(b), 3(d), and 3(f) are cross-sectional views that respectively correspond therewith.

FIGS. 4(a), 4(c), and 4(e) are plan views, and FIGS. 4(b), 4(d), and 4(f) are cross-sectional views that respectively correspond therewith.

FIG. 5 is a schematic view that shows a structure of a TFT substrate 10B included in a liquid crystal display panel of Embodiment 2 of the present invention. FIG. 5(a) is a plan view of the TFT substrate 10B, and FIG. 5(b) is a cross-sectional view of the TFT substrate 10B along the line 5B-5B' in FIG. 5(a).

FIG. 6 is a schematic view that shows a structure of a TFT substrate 10C included in a liquid crystal display panel of Embodiment 3 of the present invention. FIG. 6(a) is a plan view of the TFT substrate 10C, and FIG. 6(b) is a cross-sectional view of the TFT substrate 10C along the line 6B-6B' in FIG. 6(a).

FIG. 7(a) is a plan view, and FIG. 7(b) is a cross-sectional view along the line 7B-7B' in FIG. 7(a).

FIGS. 8(a), 8(c), and 8(e) are plan views, and FIGS. 8(b), 8(d), and 8(f) are cross-sectional views that respectively correspond therewith.

FIGS. 9(a), 9(c), and 9(e) are plan views, and FIGS. 9(b), 9(d), and 9(f) are cross-sectional views that respectively correspond therewith.

FIGS. 10(a), 10(c), and 10(e) are plan views, and FIGS. 10(b), 10(d), and 10(f) are cross-sectional views that respectively correspond therewith.

FIG. 11(a) is a plan view of the TFT substrate 10D, and FIG. 11(b) is a cross-sectional view of the TFT substrate 10D along the line 11B-11B' in FIG. 11(a).

FIG. 12 is a schematic view that shows a structure of a TFT substrate 10E included in a liquid crystal display panel of Embodiment 5 of the present invention. FIG. 12(a) is a plan view of the TFT substrate 10E, and FIG. 12(b) is a cross-sectional view of the TFT substrate 10E along the line 12B-12B' in FIG. 12(a).

FIG. 13 shows a structure of a terminal of the TFT substrate 10E. FIG. 13(a) is a plan view, and FIG. 13(b) is a cross-sectional view along the line 13B-13B' in FIG. 13(a).

FIGS. 14(a), 14(c), and 14(e) are plan views, and FIGS. 14(b), 14(d), and 14(f) are cross-sectional views that respectively correspond therewith.

FIGS. 15(a), 15(c), and 15(e) are plan views, and FIGS. 15(b), 15(d), and 15(f) are cross-sectional views that respectively correspond therewith.

FIGS. 16(a), 16(c), and 16(e) are plan views, and FIGS. 16(b), 16(d), and 16(f) are cross-sectional views that respectively correspond therewith.

FIG. 17(a) shows an equivalent circuit of a conventional liquid crystal display panel 900 with an opposite matrix structure, and FIG. 17(b) is a schematic perspective view of the liquid crystal display panel 900.

DETAILED DESCRIPTION OF EMBODIMENTS

Figure 3:
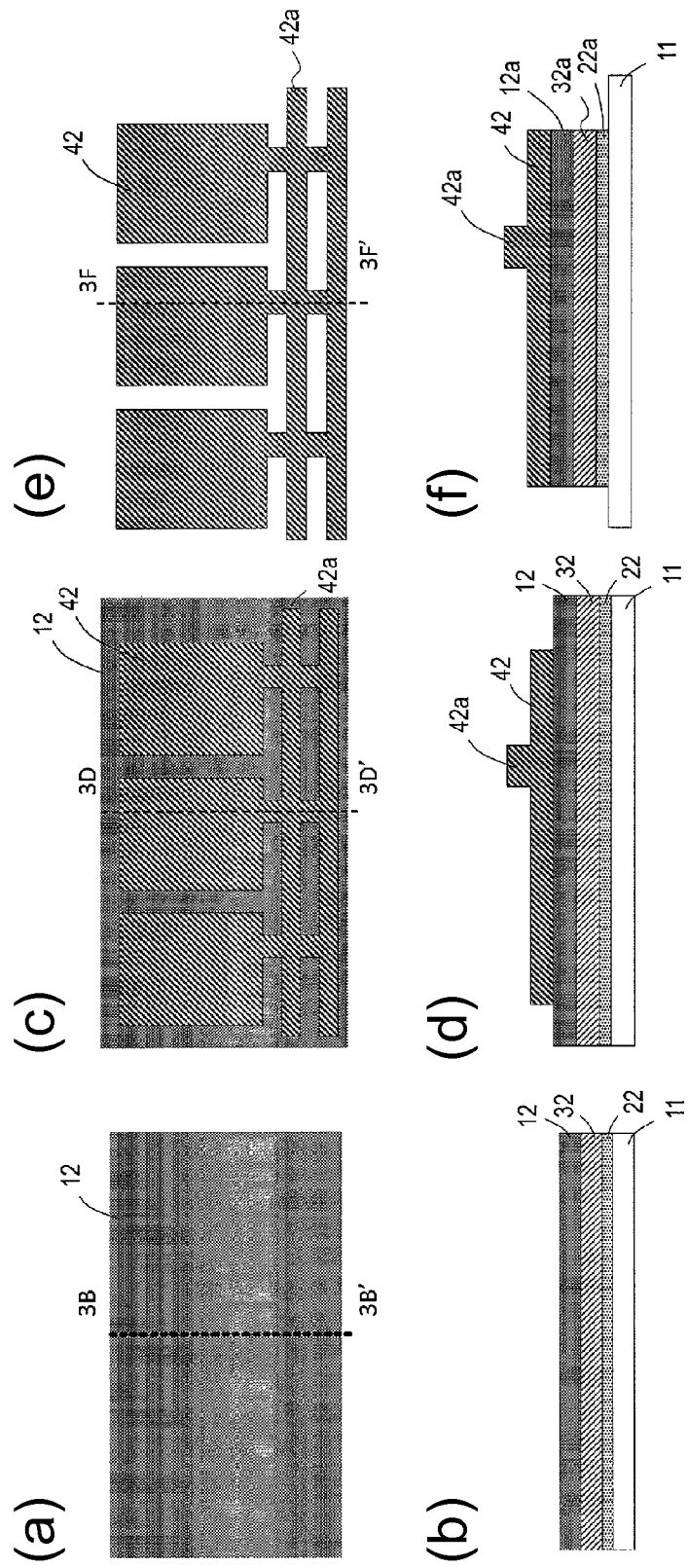
FIG. 3 shows a manufacturing process for the TFT substrate 10A.

A semiconductor device and a manufacturing method therefor of embodiments of the present invention will be described below with reference to drawings. Here, a liquid crystal display panel having an opposite matrix structure, and a TFT substrate of such a liquid crystal display panel will be described as an example of a semiconductor device that includes oxide semiconductor TFTs. Thus, a liquid crystal display panel of the embodiments can be depicted by an equivalent circuit shown in FIG. 17(a), and driven by a known method. The present invention is not limited to these embodiments.

A semiconductor device according to an embodiment of the present invention includes: a substrate; and a plurality of TFTs supported by the substrate, each of the plurality of TFTs including an oxide semiconductor layer supported by the substrate, an insulating layer formed on the oxide semiconductor layer, a first electrode (gate electrode) formed on the insulating layer, and a second electrode and a third electrode (source electrode and drain electrode) connected to the oxide semiconductor layer, the second electrode and the third electrode being made of an oxide conductive layer formed by reducing a resistance of the same oxide semiconductor film as the oxide semiconductor layer. The TFT has a basic three-layer structure. From the substrate side, the first layer is an oxide semiconductor layer and an oxide conductive layer (second and third electrodes) in which the same oxide semiconductor film as the oxide semiconductor layer is given a reduced resistance, the second layer is an insulating layer formed on the oxide semiconductor layer, and the third layer is the first electrode formed on the insulating layer.

A liquid crystal display panel and a TFT substrate 10A, and a manufacturing method therefor according to Embodiment 1 of the present invention will be described with reference to FIGS. 1 to 4.

FIG. 1 is a schematic view that shows a structure of a TFT substrate 10A and an opposite substrate 10S included in the liquid crystal display panel of Embodiment 1 of the present invention. FIG. 1(a) is a plan view of the TFT substrate 10A, FIG. 1(b) is a cross-sectional view of the TFT substrate 10A along the line 1B-1B' in FIG. 1(a), and FIG. 1(c) is a plan view of the opposite substrate 10S of FIG. 1(c).

As shown in FIGS. 1(a) and 1(b), the TFT substrate 10A includes a first substrate (a glass substrate, for example) 11, and a plurality of TFTs supported by the first substrate 11. Each TFT has an oxide semiconductor layer 22A supported by the first substrate 11, an insulating layer 32A formed on the oxide semiconductor layer 22A, a first electrode (gate electrode) 12A formed on the insulating layer 32A, and a second electrode (source electrode) 14A and a third electrode (drain electrode) 13A connected to the oxide semiconductor layer 22A. The second electrode 14A and the third electrode 13A are made of an oxide conductive layer in which the same oxide semiconductor film as the oxide semiconductor layer 22A is given a reduced resistance. The oxide semiconductor layer 22A and the insulating layer 32A are formed so as to be self-aligned with respect to the first electrode 12A.

The TFT substrate 10A further includes a plurality of pixel electrodes 15A formed on the first substrate 11 and arranged in a matrix with rows and columns, and each pixel electrode 15A is connected to the third electrode 13A of the TFT corresponding thereto among the plurality of TFTs, and is made of the oxide conductive layer in which the same oxide semiconductor film as the oxide semiconductor layer 22A is given a reduced resistance. Here, of the pixel electrodes 15A arranged in a matrix, three pixel electrodes 15A belonging to a certain row are shown.

The first electrode 12A of the TFT is connected to a common first bus line (gate bus line) 12A, and the first electrode 12A and the first bus line 12A include a first conductive layer (typically a metal layer) formed of the same conductive film. Here, the first electrode 12A is included in the gate bus line 12A.

The second electrodes 14A of TFTs corresponding to pixel electrodes 15A belonging to any row are connected to a common second bus line (common voltage bus line) 16A, and the second bus line 16A includes an oxide conductive layer in which the same oxide semiconductor film as the oxide semiconductor layer 22A is given a reduced resistance. In the TFT substrate 10A used in the liquid crystal display panel that has the opposite matrix structure, the second electrodes (source electrodes) 14A of TFTs of each row are supplied with a common voltage ($V_{COM}$), and thus, as shown in FIG. 1(a), the path through which the common voltage (electric charge corresponding to the voltage) is supplied to a given pixel electrode 15A may include not only a route "a" through the TFT corresponding to the pixel electrode 15A, but also a route "b" through the TFT corresponding to an adjacent pixel electrode 15A. Therefore, because there is no need to separate TFTs belonging to the same row, the manufacturing process can be simplified.

The resistance of an oxide semiconductor layer such as an InGaZnO (IGZO) layer is reduced by a known method such as exposure to a reducing plasma, which changes the oxide semiconductor layer into an oxide conductive layer. Thus, this method can be used for forming not only the semiconductor layer (active layer) 22A of the TFT, but also conductive layers such as the second electrodes 14A and the third electrodes 13A of the TFTs, the pixel electrodes 15A, and the second bus line (common voltage bus line) 16A. Thus, as will be described later with reference to FIGS. 3 and 4, if halftone exposure is used, then the TFT substrate 10A can be manufactured with one mask.

The opposite substrate 10S has a plurality of signal electrodes 25B supported by a second substrate (a glass substrate, for example), and each signal electrode 25B is disposed facing pixel electrodes 15A belonging to a given column. This arrangement is the same as that of the liquid crystal display panel 900 that has the conventional opposite matrix structure shown in FIG. 17(b). It is preferable that a black matrix 27B be formed in gaps between adjacent signal electrodes 25B and regions peripheral thereto (frame regions) of the second substrate, and that these regions be shielded from light. The black matrix 27B is made of a Ti layer that is 200 nm in thickness, for example, and the signal electrodes 25B are made of an ITO layer that is 100 nm in thickness, for example. The known photolithography process is conducted in order to pattern these layers, for example.

Next, with reference to FIG. 2, the structure of terminals of the TFT substrate 10A will be described. FIG. 2 shows a structure of terminals of the TFT substrate 10A. FIG. 2(a) is a plan view, and FIG. 2(b) is a cross-sectional view along the line 2B-2B' in FIG. 2(a).

The terminal 12T is a terminal of the first bus line 12A, and is formed on the oxide semiconductor layer 22T and the insulating layer 32T. The layered configuration is the same as the layered configuration including the first electrode 12A of the TFT in the TFT substrate 10A shown in FIG. 1(b). A terminal 16T is a terminal of the second bus line 16A, and corresponds to an extension portion of the second bus line 16A, having the same structure.

Figure 4:
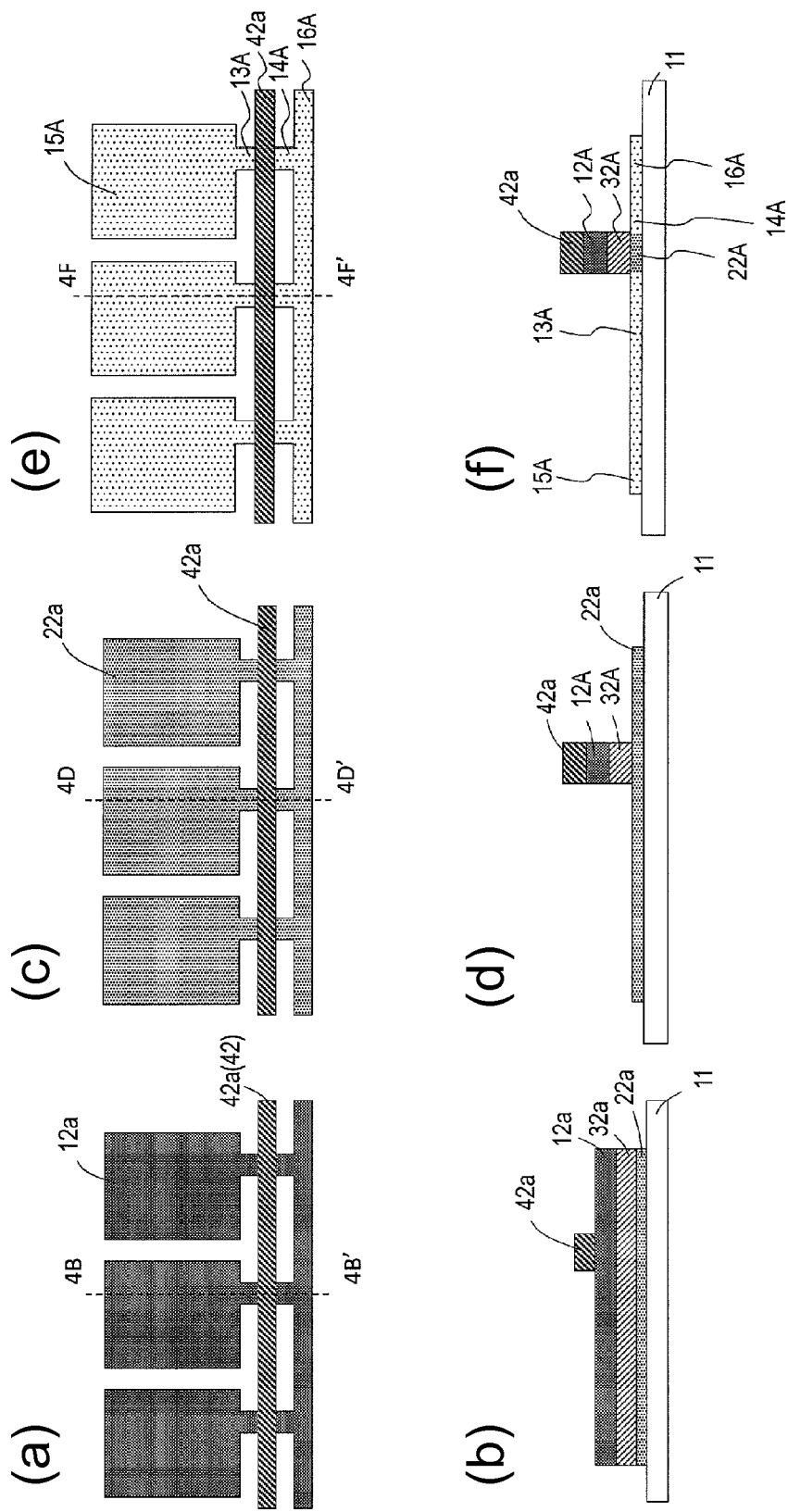
FIG. 4 shows a manufacturing process for the TFT substrate 10A (a continuation of FIG. 3).

Next, with reference to FIGS. 3 and 4, a manufacturing method for the TFT substrate 10A will be described. FIG. 3 shows a manufacturing process for the TFT substrate 10A. FIGS. 3(a), 3(c), and 3(e) are plan views, and FIGS. 3(b), 3(d), and 3(f) are cross-sectional views that respectively correspond therewith. FIG. 4 shows a manufacturing process for the TFT substrate 10A (a continuation of FIG. 3). FIGS. 4(a), 4(c), and 4(e) are plan views, and FIGS. 4(b), 4(d), and 4(f) are cross-sectional views that respectively correspond therewith.

First, as shown in FIGS. 3(a) and 3(b), an oxide semiconductor film (an IGZO film 50 nm in thickness, for example) 22, an insulating film (a layered configuration of an $SiO_2$ film 50 nm in thickness and an $SiN_x$ film 325 nm in thickness, for example) 32, and a first conductive film (layered configuration of a Ti film 100 nm in thickness, an Al film 200 nm in thickness, and a Ti film 30 nm in thickness, for example) 12 are formed on almost the entire surface of the glass substrate 11.

Next, as shown in FIGS. 3(c) and 3(d), a mask 42 having a prescribed pattern is formed using photoresist. The mask 42 is formed by halftone exposure, and has a thick portion 42a that is thicker than other regions.

Next, as shown in FIGS. 3(e) and 3(f), using the mask 42, the oxide semiconductor film 22, the insulating film 32, and the first conductive film 12 are etched, forming an oxide semiconductor layer 22a, an insulating layer 32a, and a first conductive layer 12a having a prescribed pattern.

Next, as shown in FIGS. 4(a) and 4(b), ashing is conducted on the mask 42 so as to selectively leave only the thick portion 42a of the mask 42.

Next, as shown in FIGS. 4(c) and 4(d), by etching the insulating layer 32a and the first conductive layer 12a by using the thick portion 42a of the mask, an insulating layer 32A and a first electrode 12A having a final pattern are formed.

Next, as shown in FIGS. 4(e) and 4(f), regions of the oxide semiconductor layer 22a upon which the insulating layer 32A, the first electrode 12A, and the thick portion 42a of the mask are not formed are given a reduced resistance by exposure to a reducing plasma or the like, for example. By doing so, the second electrode 14A and the third electrode 13A of the TFT, the pixel electrode 15A, and the second bus line (common voltage bus line) 16A are formed of the oxide conductive layer, which was formed by reducing the resistance of the oxide semiconductor layer 22a. In this manner, the oxide semiconductor layer 22A and the insulating layer 32A are formed so as to be self-aligned with respect to the first electrode (first conductive layer) 12A.

The TFT substrate 10A shown in FIGS. 1(a) and 1(b) can be obtained by following the steps above. An alignment film and the like are formed on the TFT substrate 10A as necessary.

Then, with a liquid crystal material held between the TFT substrate 10A and the separately prepared opposite substrate 10S, the TFT substrate 10A and the opposite substrate 10S are bonded together, thus obtaining the liquid crystal display panel of the present embodiment. The thickness of the liquid crystal layer (the size of the gap between the TFT substrate 10A and the opposite substrate 10S) is controlled by photospacers, for example. Injection of the liquid crystal material is conducted by a known method such as the one drop filling method. Then, as necessary, a polarizing plate, a retardation plate, and the like are sometimes provided.

In FIG. 5, a structure of the TFT substrate 10B included in a liquid crystal display panel of Embodiment 2 of the present invention is shown. FIG. 5(a) is a plan view of the TFT substrate 10B, and FIG. 5(b) is a cross-sectional view of the TFT substrate 10B along the line 5B-5B' in FIG. 5(a).

The TFT substrate 10B is similar to the TFT substrate 10A, except that the gap between the pixel electrode 15A and the first bus line (gate bus line) 12A in the TFT substrate 10A is not present in the TFT substrate 10B, and the gap between the first bus line 12A and the second bus line (common voltage bus line) 16A is also not present in the TFT substrate 10B.

In the TFT substrate 10B, the first bus line 12B includes a first electrode (gate electrode) 12B, the second bus line 16B includes a second electrode (source electrode) 14B, and the pixel electrode 15B includes a third electrode 13B. Also, when viewing the first substrate 11 from the normal line direction, gaps are not present between the first bus line 12B and the second bus line 16B, or between the first bus line 12B and the pixel electrode 15B. The TFT substrate 10B has an advantage in having a larger pixel aperture ratio than the TFT substrate 10A. Also, the width of the portion of the TFT substrate 10B that connects the pixel electrode 15B and the second bus line 16B is greater than the width of the portion of the TFT substrate 10A that connects the pixel electrode 15A and the second bus line 16A (width of the second electrode 14A and the third electrode 13A and the channel width of the oxide semiconductor layer 22A), thus having the advantage of being able to supply an electric charge to the pixel electrode 15B quickly. The TFT substrate 10B can be manufactured by a manufacturing method similar to that of the TFT substrate 10A.

In the TFT substrates 10A and 10B of Embodiments 1 and 2, the second bus lines (common voltage bus lines) 16A and 16B are formed only of oxide conductive layers in which the same oxide semiconductor film as the oxide semiconductor layer 22A is given a reduced resistance. Thus, in a large liquid crystal display panel or the like, for example, there are cases in which the conductivity of the second bus lines 16A and 16B is not sufficiently large (the resistivity is not sufficiently small).

An example of a TFT substrate of an embodiment in which the second bus line (common voltage bus line) is constituted of an oxide conductive layer and a conductive layer formed on the oxide conductive layer will be described.

With reference to FIGS. 6 to 10 a manufacturing method for a liquid crystal display panel and a TFT substrate 10C of Embodiment 3 of the present invention will be described.

FIG. 6 is a schematic view of a structure of the TFT substrate 10C included in the liquid crystal display panel of Embodiment 3 of the present invention. FIG. 6(a) is a plan view of the TFT substrate 10C, and FIG. 6(b) is a cross-sectional view of the TFT substrate 10C along the line 6B-6B' in FIG. 6(a).

As shown in FIGS. 6(a) and 6(b), each of the TFTs included in the TFT substrate 10C includes an oxide semiconductor layer 22C supported by a first substrate 11, an insulating layer 32C formed on the oxide semiconductor layer 22C, a first electrode (gate electrode) 12C formed on the insulating layer 32C, and a second electrode (source electrode) 14C and a third electrode (drain electrode) 13C connected to the oxide semiconductor layer 22C. The second electrode 14C and the third electrode 13C are made of an oxide conductive layer in which the same oxide semiconductor film as the oxide semiconductor layer 22C is given a reduced resistance.

The TFT substrate 10C further includes a plurality of pixel electrodes 15C formed on the first substrate 11 and arranged in a matrix with rows and columns, and each pixel electrode 15C is connected to the third electrode 13C of the corresponding TFT out of the plurality of TFTs, and is made of an oxide conductive layer formed from the same oxide semiconductor film as the oxide semiconductor layer 22C but given a reduced resistance.

The first electrode 12C of the TFT is connected to a common first bus line (gate bus line) 12C, and the first electrode 12C and the first bus line 12C include a first conductive layer (typically a metal layer) formed of the same conductive film. Here, the first electrode 12C is included in the gate bus line 12C.

Second electrodes 14C of TFTs corresponding to pixel electrodes 15C belonging to a given row are connected to a common second bus line (constituted of the oxide conductive layer 16C and the second conductive layer 18C), and the second bus line (16C and 18C) includes the oxide conductive layer 16C in which the same oxide semiconductor film as the oxide semiconductor layer 22C is given a reduced resistance. The second bus line (16C and 18C) further has the second conductive layer 18C formed on the oxide conductive layer 16C. The second conductive layer 18C is made of the same conductive film as the first conductive layer included in the first electrode 12C and the first bus line 12C. The oxide conductive layer 16C included in the second bus line (16C and 18C) is formed so as to be self-aligned with respect to the second conductive layer 18C.

As is clear from comparing FIGS. 6 and 1, in the TFT substrate 10C, in addition to the configuration of the TFT substrate 10A, the second bus line (16C and 18C) has the second conductive layer 18C. Thus, the TFT substrate 10C has the effects attained with the TFT substrate 10A, and has an additional advantage that the second bus line has a high conductivity. However, as will be described later with reference to FIGS. 8 to 10, two masks are necessary in order to manufacture the TFT substrate 10C.

Figure 7:
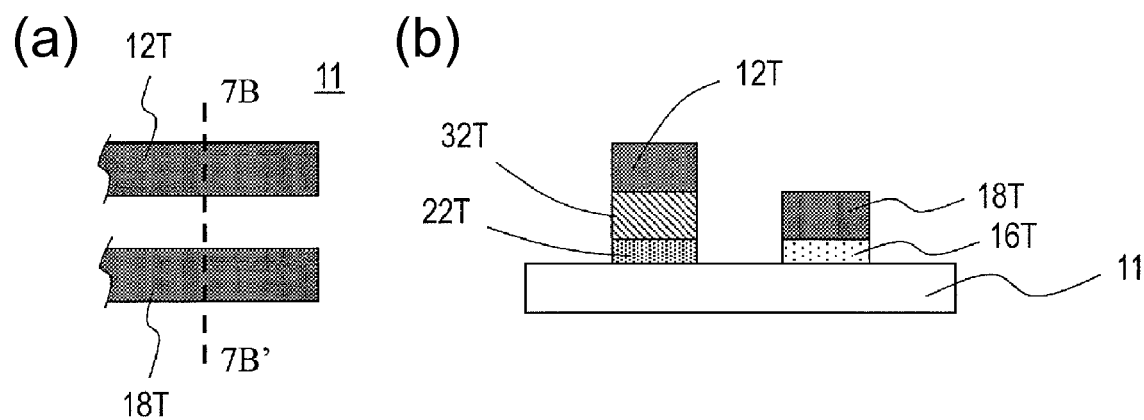
FIG. 7 shows a structure of terminals of the TFT substrate 10C.

Next, with reference to FIG. 7, the structure of terminals of the TFT substrate 10C will be described. FIG. 7 shows a structure of terminals of the TFT substrate 10C. FIG. 7(a) is a plan view, and FIG. 7(b) is a cross-sectional view along the line 7B-7B' in FIG. 7(a).

The terminal 12T is a terminal of the first bus line 12C, and is formed on the oxide semiconductor layer 22T and the insulating layer 32T. The layered configuration is the same as the layered configuration including the first electrode 12C of the TFT in the TFT substrate 10C shown in FIG. 6(b). The terminals 16T and 18T are terminals of the second bus lines (16C and 18C), and correspond to the extension portions of the second bus lines (16C and 18C), and have the same structure.

Figure 8:
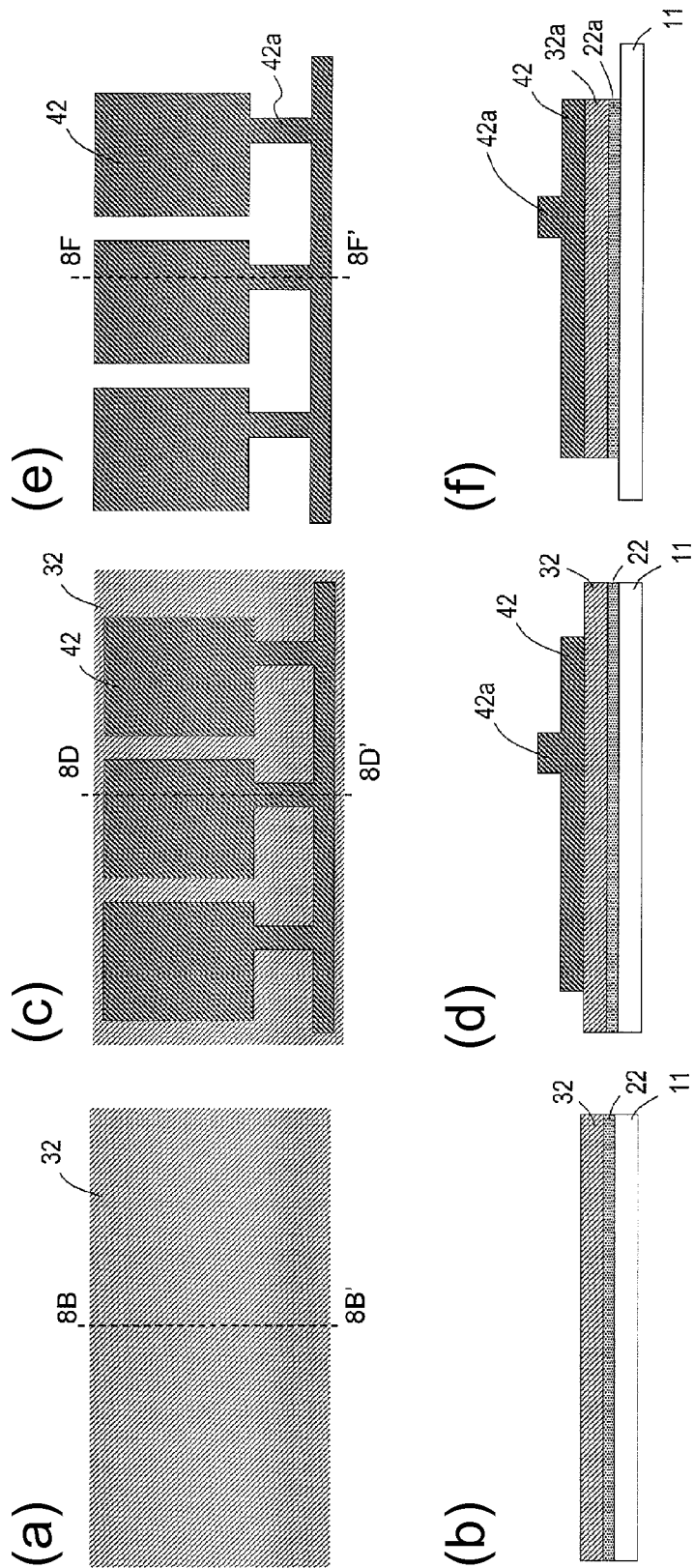
FIG. 8 shows a manufacturing process for the TFT substrate 10C.
Figure 9:
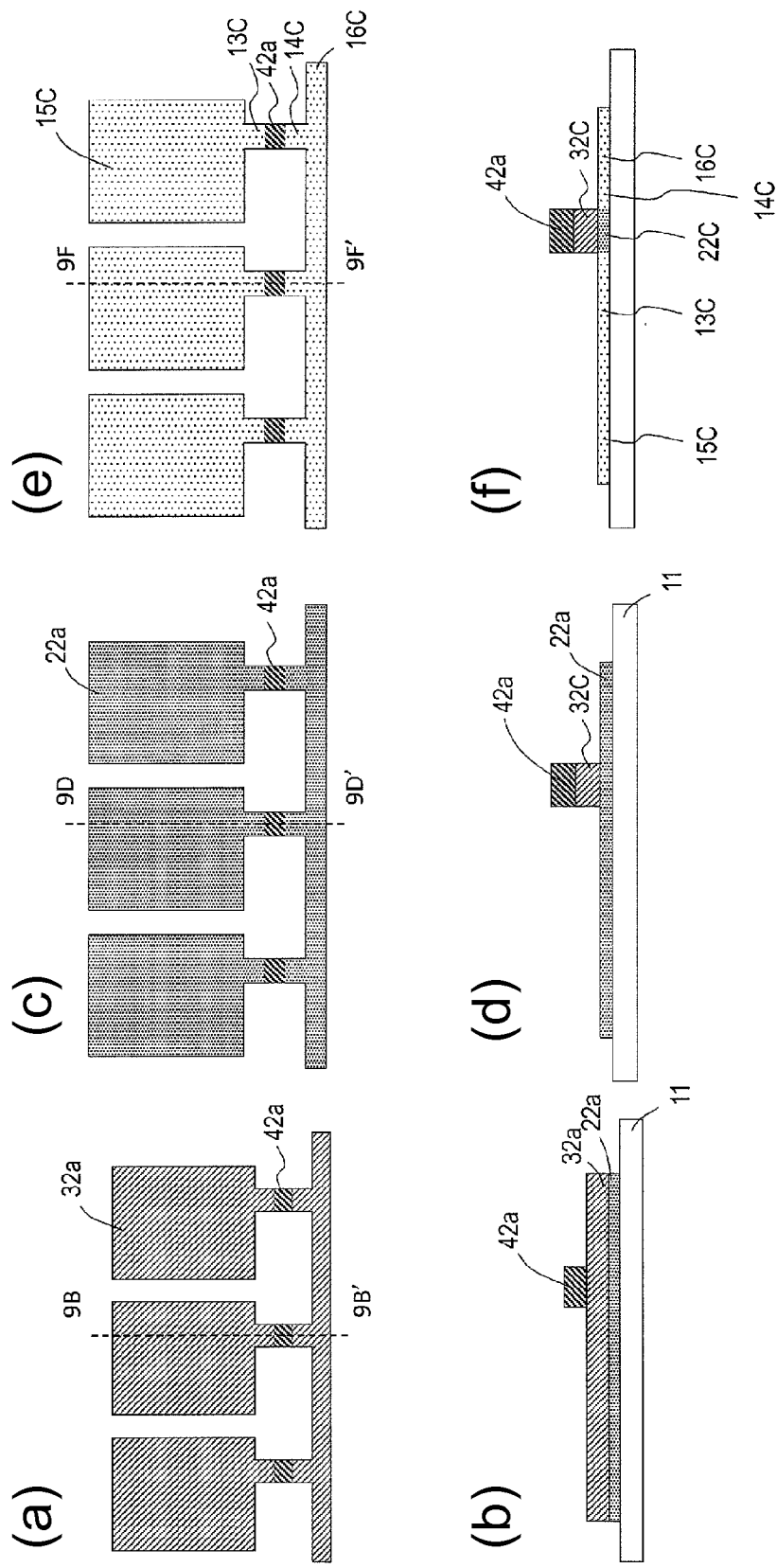
FIG. 9 shows a manufacturing process for the TFT substrate 10C (a continuation of FIG. 8).
Figure 10:
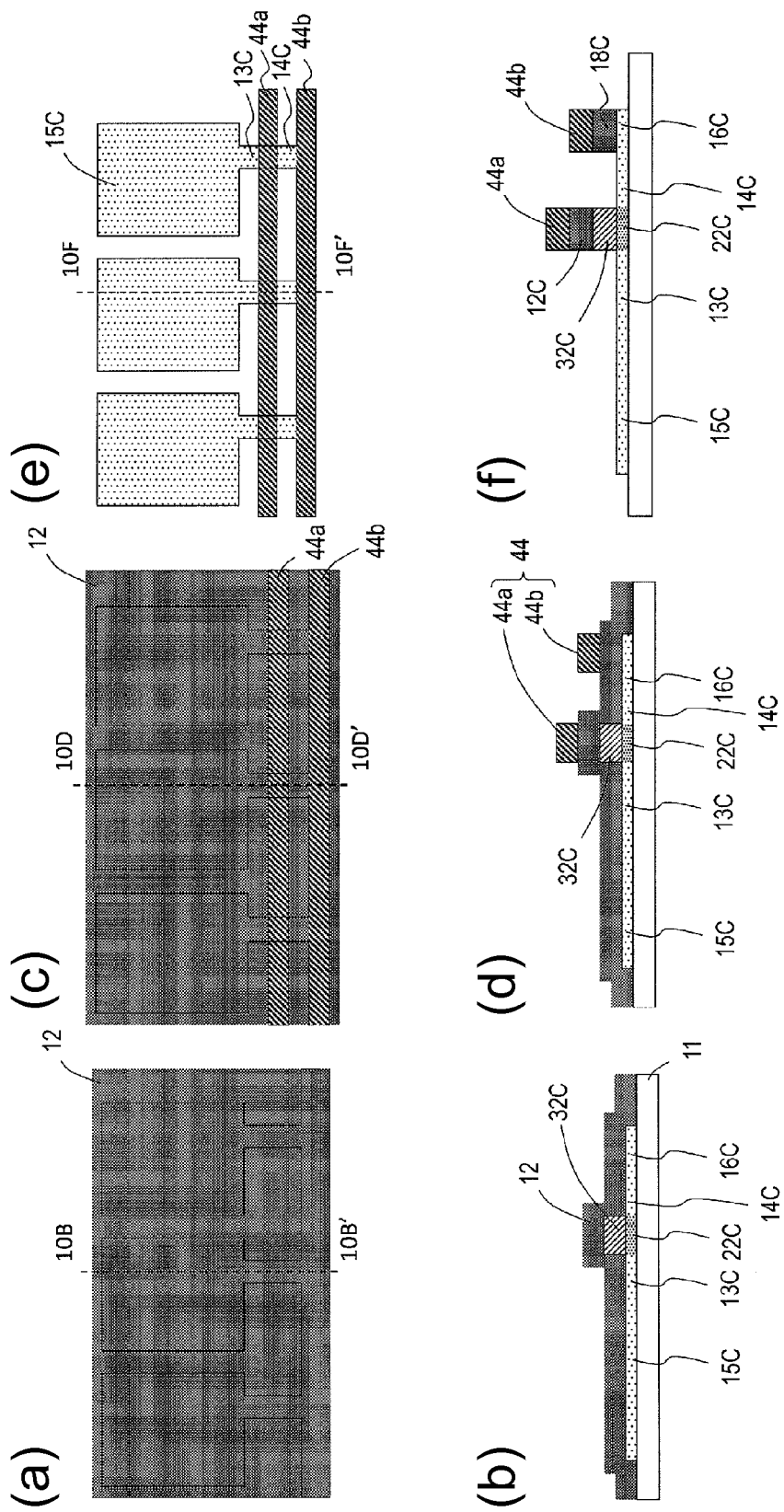
FIG. 10 shows a manufacturing process for the TFT substrate 10C (a continuation of FIG. 9).

Next, with reference to FIGS. 8, 9, and 10, a manufacturing method for the TFT substrate 10C will be described. FIG. 8 shows a manufacturing process for the TFT substrate 10C. FIGS. 8(a), 8(c), and 8(e) are plan views, and FIGS. 8(b), 8(d), and 8(f) are cross-sectional views that respectively correspond therewith. FIG. 9 shows a manufacturing process for the TFT substrate 10C (a continuation of FIG. 8). FIGS. 9(a), 9(c), and 9(e) are plan views, and FIGS. 9(b), 9(d), and 9(f) are cross-sectional views that respectively correspond therewith. FIG. 10 shows a manufacturing process for the TFT substrate 10C (a continuation of FIG. 9). FIGS. 10(a), 10(c), and 10(e) are plan views, and FIGS. 10(b), 10(d), and 10(f) are cross-sectional views that respectively correspond therewith.

First, as shown in FIGS. 8(a) and 8(b), the oxide semiconductor film (an IGZO film 50 nm in thickness, for example) 22 and the insulating film (a layered configuration of an $SiO_2$ film 50 nm in thickness and an $SiN_x$ film 325 nm in thickness, for example) 32 are formed on almost the entire surface of the glass substrate.

Next, as shown in FIGS. 8(c) and 8(d), a mask 42 having a prescribed pattern is formed using photoresist. The mask 42 is formed by halftone exposure, and has a thick portion 42a that is thicker than other regions.

Next, as shown in FIGS. 8(e) and 8(f), the oxide semiconductor film 22 and the insulating film 32 are etched using the mask 42, and an oxide semiconductor layer 22a and an insulating layer 32a are formed with a prescribed pattern.

Next, as shown in FIGS. 9(a) and 9(b), ashing is conducted on the mask 42 so as to selectively leave only the thick portion 42a of the mask 42.

Next, as shown in FIGS. 9(c) and 9(d), by etching the insulating layer 32a using the thick portion 42a of the mask, an insulating layer 32C having a final pattern is formed.

Next, as shown in FIGS. 9(e) and 9(f), regions of the oxide semiconductor layer 22a where the insulating layer 32C and the thick portion 42a of the mask are not formed are doped with hydrogen ions at approximately $10^{18}$ to $10^{19}$ $cm^{-3}$ with a CVD device or the like, or the oxide semiconductor layer 22a is exposed to a reducing plasma or the like, for example, in order to reduce the resistance of the oxide semiconductor layer 22a. In this manner, the second electrode 14C and the third electrode 13C of the TFT, the pixel electrode 15C, and the oxide conductive layer 16C, which is a component of the second bus line (common voltage bus line), are made of an oxide conductive layer formed by reducing the resistance of the oxide semiconductor layer 22a. The resistivity of the oxide semiconductor layer 22a before reducing the resistance thereof is greater than $10^0$ $\Omega \cdot cm$ and less than or equal to $10^7$ $\Omega \cdot cm$, for example, whereas the resistivity of the oxide conductive layer 16C obtained by reducing the resistance of the oxide semiconductor layer 22a is less than or equal to $10^0$ $\Omega \cdot cm$, for example.

After the mask 42a is removed by ashing, as shown in FIGS. 10(a) and 10(b), the first conductive film (a layered configuration of a Ti film 100 nm in thickness, an Al film 200 nm in thickness, and a Ti film 30 nm in thickness, for example) 12 is formed covering almost the entire surface of the substrate 11.

Next, as shown in FIGS. 10(c) and 10(d), a mask 44 having a prescribed pattern is formed using photoresist. The mask 44 has a portion 44a corresponding to the first bus line 12C, and a portion 44b corresponding to the second conductive layer 18C, which is a component of the second bus line.

Next, as shown in FIGS. 10(e) and 10(f), the first conductive film 12 is etched using the mask 44, and the first bus line 12C and the second conductive layer 18C of the second bus line are formed with a final pattern. The second bus line is constituted of the oxide conductive layer 16C and the second conductive layer 18C. Then, the mask 44 is removed by ashing.

The TFT substrate 10C shown in FIGS. 6(a) and 6(b) can be obtained by following the steps above. An alignment film and the like are formed on the TFT substrate 10C as necessary.

Then, with a liquid crystal material held between the TFT substrate 10C and the separately prepared opposite substrate 10S (refer to FIG. 1(c)), the TFT substrate 10C and the opposite substrate 10S are bonded together, thus obtaining the liquid crystal display panel of the present embodiment.

Figure 11:
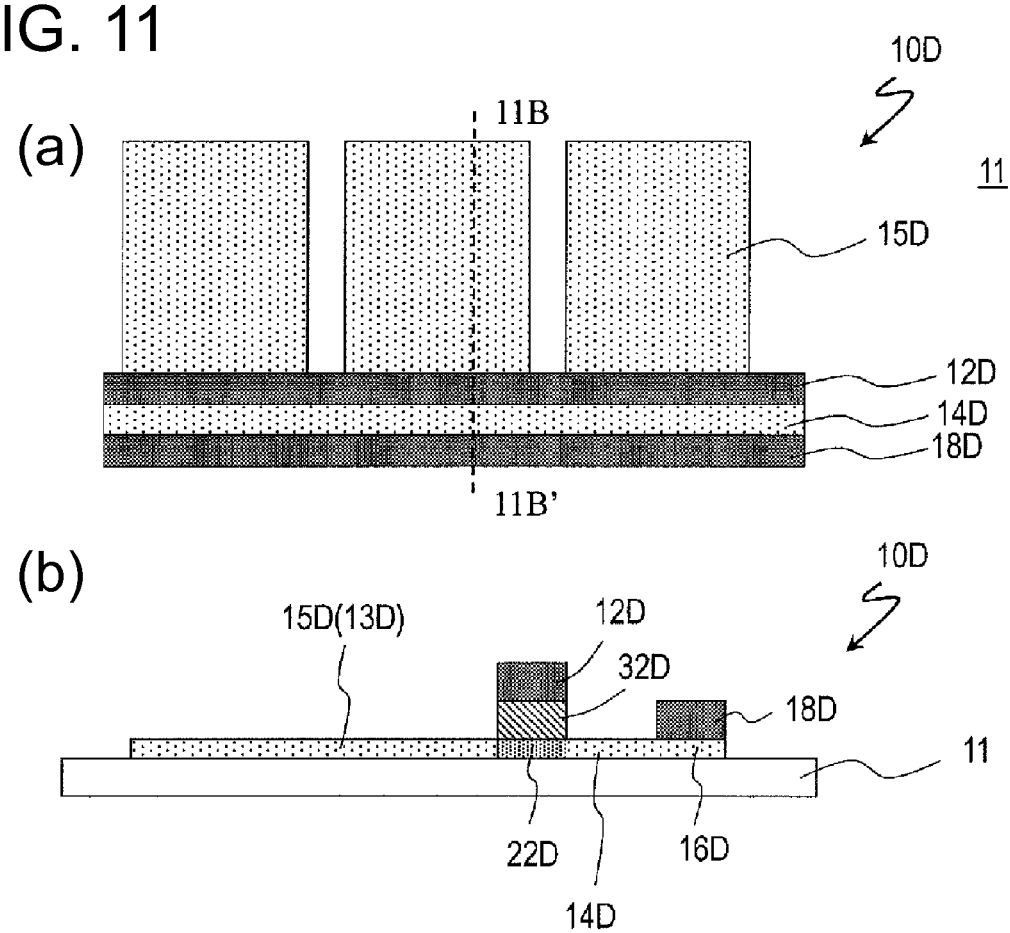
FIG. 11 is a schematic view that shows a structure of a TFT substrate 10D included in a liquid crystal display panel of Embodiment 4 of the present invention.

In FIG. 11, a structure of a TFT substrate 10D included in a liquid crystal display panel of Embodiment 4 of the present invention is shown. FIG. 11(a) is a plan view of the TFT substrate 10D, and FIG. 11(b) is a cross-sectional view of the TFT substrate 10D along the line 11B-11B' in FIG. 11(a).

The gap that was between the pixel electrode 15C and the first bus line (gate bus line) 12C in the TFT substrate 10C (FIG. 6) is not present in the TFT substrate 10D, and the gap between the first bus line 12C and the second conductive layer 18C of the second bus line is filled with an oxide conductive layer.

In the TFT substrate 10D, the first bus line 12D includes a first electrode (gate electrode) 12D, and the pixel electrode 15D includes a third electrode 13D. In addition, when viewing the first substrate 11 from the normal line direction, there is no gap between the first bus line 12D and the pixel electrode 15D, and the gap between the first bus line 12D and the second conductive layer 18D of the second bus line is filled with the second electrode 14D. The second electrode 14D is formed integrally with the oxide conductive layer 16D of the second bus line, and it can be said that the oxide conductive layer 16D of the second bus line includes the second electrode 14D. In any case, the gap between the first bus line 12D and the second conductive layer 18D of the second bus line is filled with an oxide conductive layer (14D or 16D).

The TFT substrate 10D has an advantage in having a larger pixel aperture ratio than the TFT substrate 10C. The width of the part of the TFT substrate 10D where the pixel electrode 15D connects with the second bus lines 16D and 18D is greater than the width of the part of the TFT substrate 10C where the pixel electrode 15C connects with the second bus lines 16C and 18C (width of the second electrode 14C and the third electrode 13C, and the channel width of the oxide semiconductor layer 22C), and thus, the TFT substrate 10D has the advantage of being able to supply an electric charge to the pixel electrode 15B quickly. The TFT substrate 10D can be manufactured by a manufacturing method similar to that of the TFT substrate 10C.

Next, with reference to FIGS. 12 to 16, a manufacturing method for a liquid crystal display panel and a TFT substrate 10E of Embodiment 5 of the present invention will be described.

FIG. 12 is a schematic view of a structure of the TFT substrate 10E included in a liquid crystal display panel of Embodiment 5 of the present invention. FIG. 12(a) is a plan view of the TFT substrate 10E, and FIG. 12(b) is a cross-sectional view of the TFT substrate 10E along the line 12B-12B' in FIG. 12(a).

As shown in FIGS. 12(a) and 12(b), the TFT included in the TFT substrate 10E has an oxide semiconductor layer 22E supported by a first substrate 11, an insulating layer 32E formed on the oxide semiconductor layer 22E, a first electrode (gate electrode) 12EG formed on the insulating layer 32E, and a second electrode (source electrode) 14E and a third electrode (drain electrode) 13E connected to the oxide semiconductor layer 22E. The TFT substrate 10E also includes a lead-out wiring line 17E that extends from the second electrode 14E and that is connected to a first bus line 12E of an adjacent row. The second electrode 14E, the lead-out wiring line 17E, and the third electrode 13E include an oxide conductive layer in which the same oxide semiconductor film as the oxide semiconductor layer 22E is given a reduced resistance.

The TFT substrate 10E further has a plurality of pixel electrodes 15E formed on the first substrate 11 and arranged in a matrix with rows and columns, and each pixel electrode 15E is connected to the third electrode 13E of a corresponding TFT out of the plurality of TFTs, and is made of an oxide conductive layer in which the same oxide semiconductor film as the oxide semiconductor layer 22E is given a reduced resistance.

The first electrode 12EG of each of the TFTs is connected to a common first bus line (gate bus line) 12E, and the first electrode 12EG and the first bus line 12E include a first conductive layer (typically a metal layer) made of the same conductive film. Here, the first electrode 12EG is a part that branches away from the gate bus line 12E.

The second electrodes 14E of the TFTs corresponding to pixel electrodes 15E of a given row are connected to a first bus line 12E of an adjacent row via the lead-out wiring lines 17E.

In other words, the second electrodes 14E of the TFTs corresponding to the pixel electrodes 15E belonging to row "m" are connected to the first bus line 12E ($m^{-1}$) via the lead-out wiring lines 17E. The first bus line 12E ($m^{-1}$) supplies a common voltage to the second electrode 14E when the TFTs of row "m" are on, or in other words, when an on signal voltage is supplied to the first bus line 12E ($m^{-1}$). In this manner, the first bus line 12E ($m^{-1}$) in row "$m^{-1}$" acts as the above-mentioned second bus line (common voltage bus line) for the pixel electrode 15E of row "m". Thus, the TFT substrate 10E has an advantage compared to the TFT substrates 10A to 10D in the previous embodiments in having a greater pixel aperture ratio. Also, the TFT substrate 10E has an advantage compared to the TFT substrates 10A and 10B in which the second bus lines are constituted only of an oxide conductive layer in having a greater ability (conductivity of the wiring lines) to supply common voltage.

Next, with reference to FIG. 13, the structure of a terminal of the TFT substrate 10E will be described. FIG. 13 shows a structure of a terminal of the TFT substrate 10E. FIG. 13(a) is a plan view, and FIG. 13(b) is a cross-sectional view along the line 13B-13B' in FIG. 13(a).

As stated above, the TFT substrate 10E has a structure in which the first bus line 12E also functions as the second bus line of previous embodiments, and thus, only the terminal 12T of the first bus line 12E is included. The terminal 12T is formed directly on the substrate 11.

Figure 14:
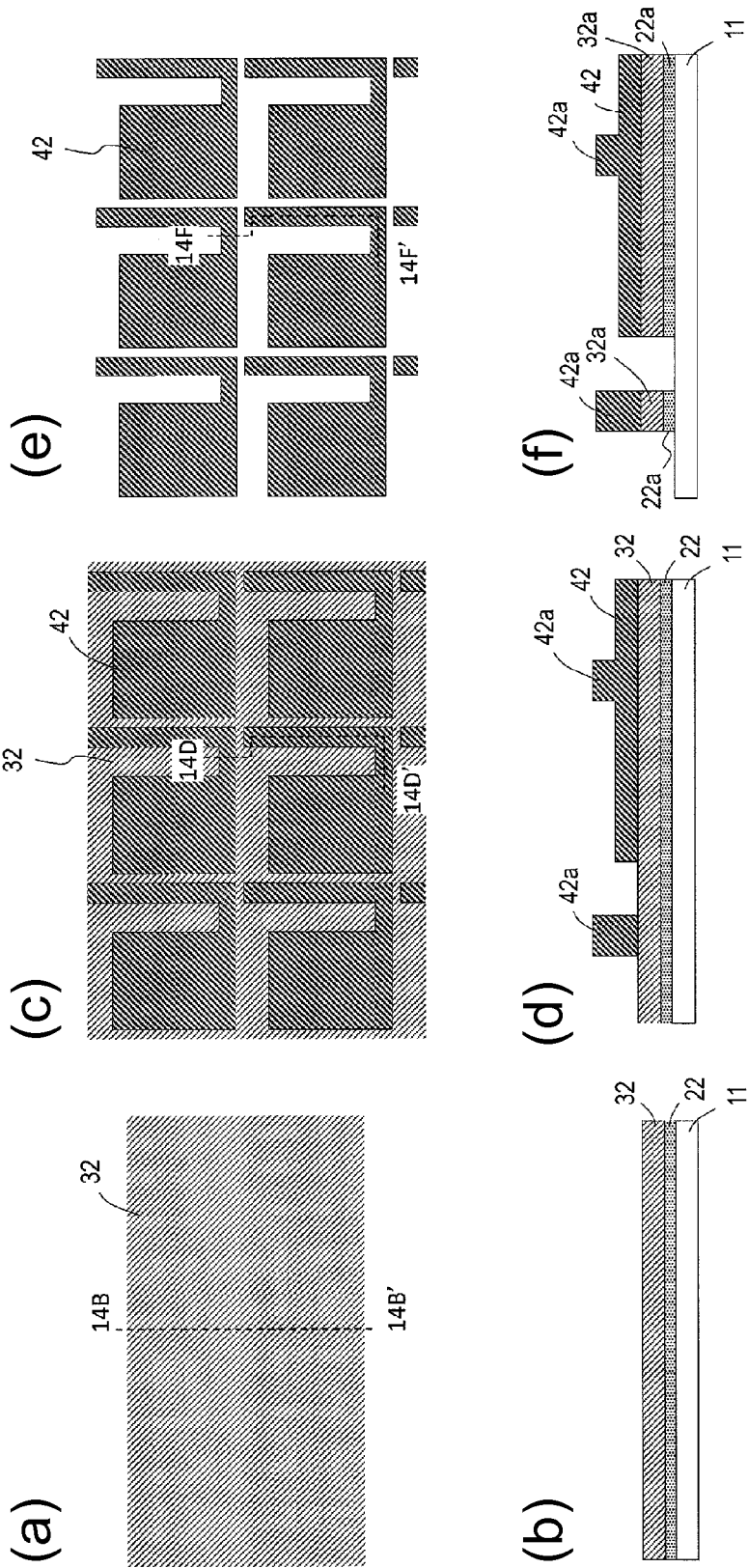
FIG. 14 shows a manufacturing process for the TFT substrate 10E.
Figure 15:
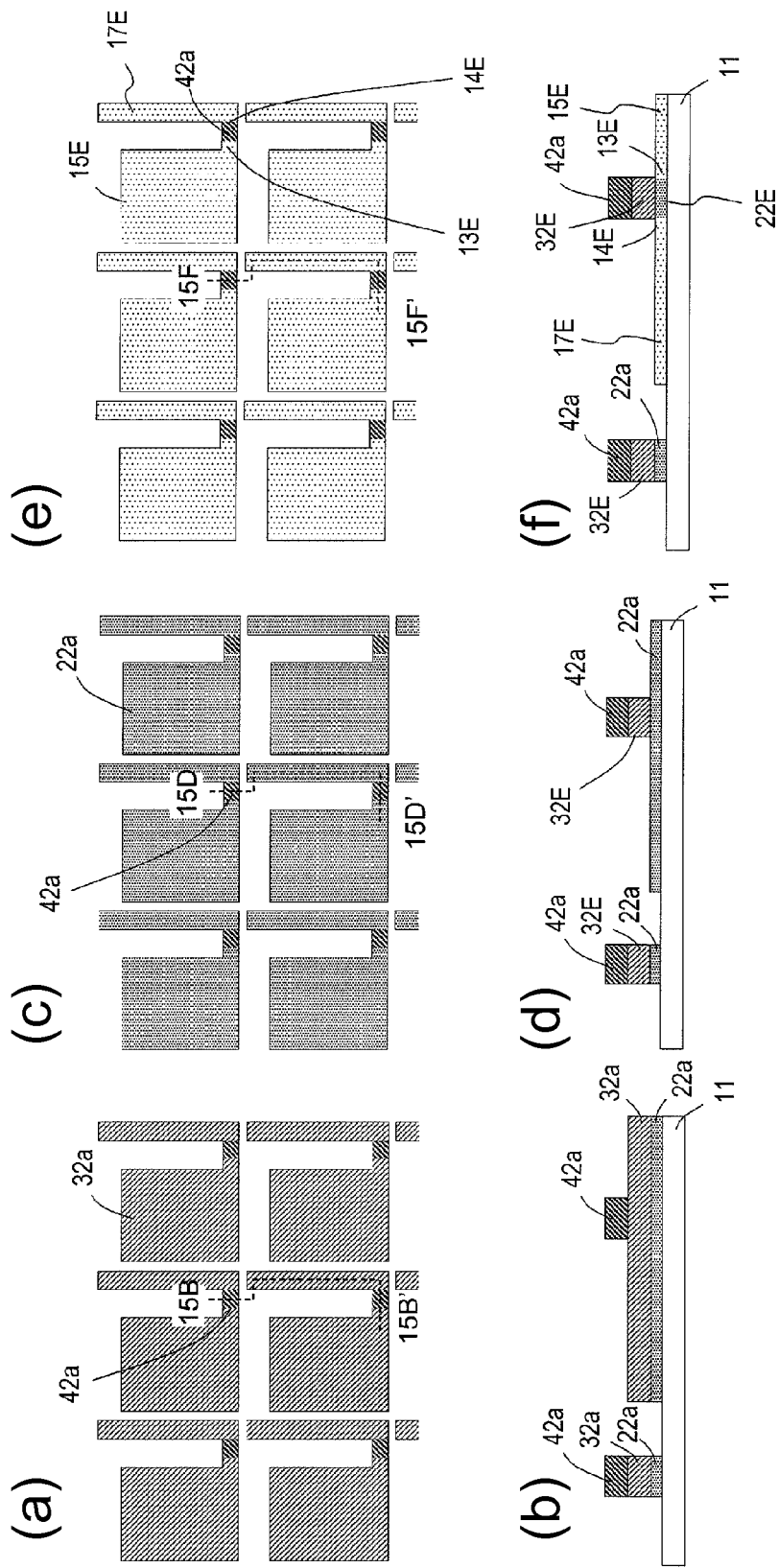
FIG. 15 shows a manufacturing process for the TFT substrate 10E (a continuation of FIG. 14).
Figure 16:
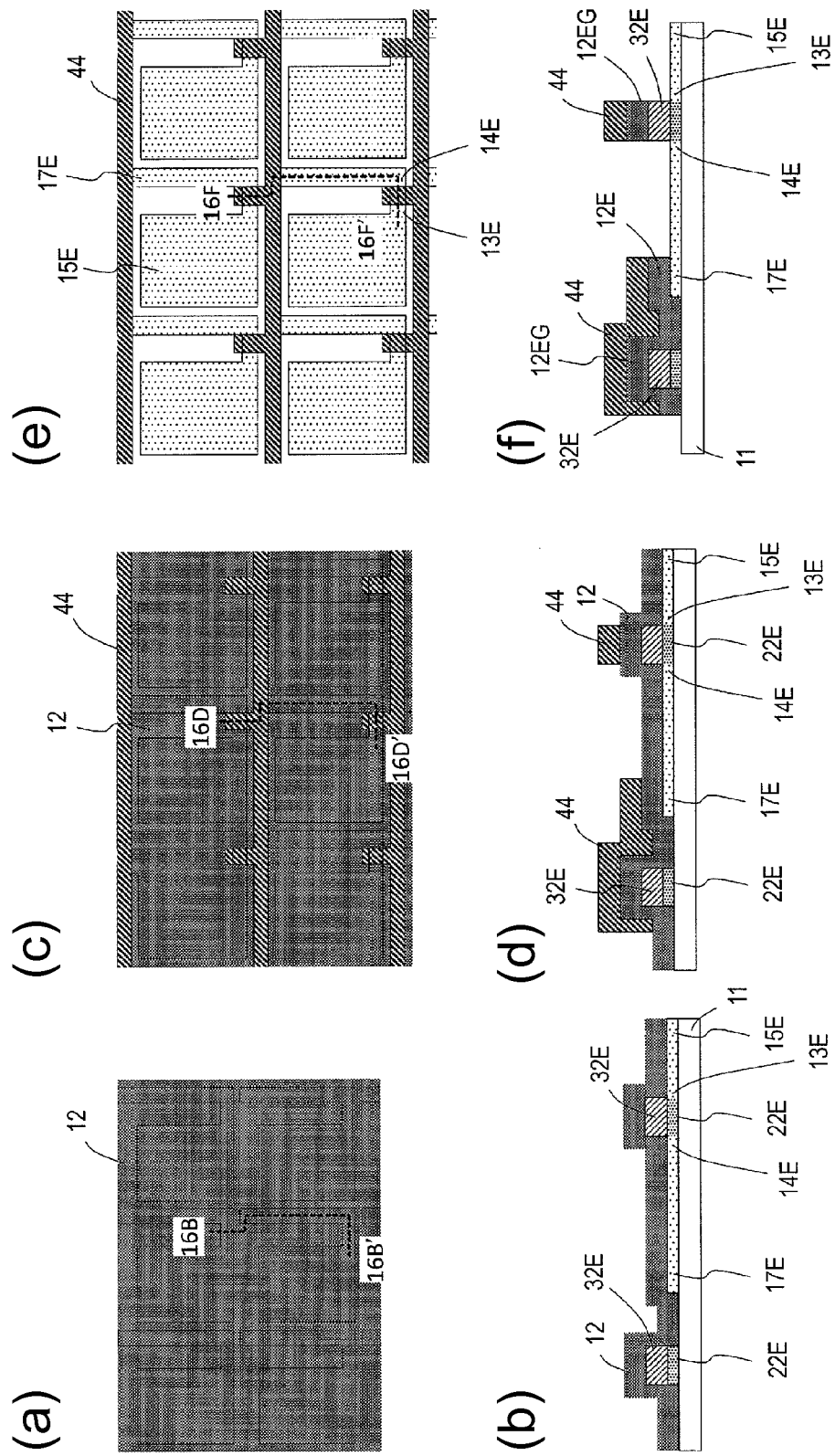
FIG. 16 shows a manufacturing process for the TFT substrate 10E (a continuation of FIG. 15).

Next, with reference to FIGS. 14, 15, and 16, a manufacturing method for the TFT substrate 10E will be described. FIG. 14 shows a manufacturing process of the TFT substrate 10E. FIGS. 14(a), 14(c), and 14(e) are plan views, and FIGS. 14(b), 14(d), and 14(f) are cross-sectional views that respectively correspond therewith. FIG. 15 shows a manufacturing process of the TFT substrate 10E (continuation of FIG. 14). FIGS. 15(a), 15(c), and 15(e) are plan views, and FIGS. 15(b), 15(d), and 15(f) are cross-sectional views that respectively correspond therewith. FIG. 16 shows a manufacturing process of the TFT substrate 10E (continuation of FIG. 15). FIGS. 16(a), 16(c), and 16(e) are plan views, and FIGS. 16(b), 16(d), and 16(f) are cross-sectional views that respectively correspond therewith.

First, as shown in FIGS. 14(a) and 14(b), the oxide semiconductor film (an IGZO film 50 nm in thickness, for example) 22 and the insulating film (a layered configuration of an $SiO_2$ film 50 nm in thickness and an $SiN_x$ film 325 nm in thickness, for example) 32 are formed on almost the entire surface of the glass substrate 11.

Next, as shown in FIGS. 14(c) and 14(d), a mask 42 having a prescribed pattern is formed using photoresist. The mask 42 is formed by halftone exposure, and has thick portions 42a that are thicker than other regions.

Next, as shown in FIGS. 14(e) and 14(f), the oxide semiconductor film 22 and the insulating film 32 are etched using the mask 42, and an oxide semiconductor layer 22a and an insulating layer 32a are formed with a prescribed pattern.

Next, as shown in FIGS. 15(a) and 15(b), ashing is conducted on the mask 42 so as to selectively leave only the thick portions 42a of the mask 42.

Next, as shown in FIGS. 15(c) and 15(d), by etching the insulating layer 32a using the thick portions 42a of the mask, an insulating layer 32E having a final pattern is formed.

Next, as shown in FIGS. 15(e) and 15(f), regions of the oxide semiconductor layer 22a where the insulating layer 32E and the thick portion 42a of the mask are not formed are given a reduced resistance by exposing the region to a reducing plasma, for example. In this manner, the second electrode 14E and the third electrode 13E of the TFT, the pixel electrode 15E, and the lead-out wiring line 17E are formed of the oxide conductive layer obtained by reducing the resistance of the oxide semiconductor layer 22a.

After the thick portion 42a is removed by ashing, as shown in FIGS. 16(a) and 16(b), the first conductive film (a layered configuration of a Ti film 100 nm in thickness, an Al film 200 nm in thickness, and a Ti film 30 nm in thickness, for example) 12 is formed covering almost the entire surface of the substrate 11.

Next, as shown in FIGS. 16(c) and 16(d), a mask 44 having a prescribed pattern is formed using photoresist. The mask 44 has a pattern corresponding to the first bus line 12E and the first electrode 12EG.

Next, as shown in FIGS. 16(e) and 16(f), the first conductive film 12 is etched using the mask 44, and the first bus line 12E and the first electrode 12EG are formed with a final pattern. Then, the mask 44 is removed by ashing.

The TFT substrate 10E shown in FIGS. 12(a) and 12(b) can be obtained by following the steps above. An alignment film and the like are formed on the TFT substrate 10E as necessary.

Then, with a liquid crystal material held between the TFT substrate 10E and the separately prepared opposite substrate 10S (refer to FIG. 1(c)), the TFT substrate 10E and the opposite substrate 10S are bonded together, thus obtaining the liquid crystal display panel of the present embodiment Industrial Applicability The present invention can be widely applied to a semiconductor device having oxide semiconductor TFTs, and a manufacturing method therefor. The semiconductor device is a liquid crystal display panel or a TFT substrate used in a liquid crystal display panel, for example.

DESCRIPTION OF REFERENCE CHARACTERS

10A TFT substrate
11 first substrate (glass substrate)
12A first electrode (gate electrode)
13A third electrode (drain electrode)
14A second electrode (source electrode)
15A pixel electrode
22A oxide semiconductor layer
32A insulating layer
42, 44 mask

The invention claimed is:

1. A semiconductor device comprising:
a first substrate;
a plurality of TFTs supported by the first substrate,
a plurality of pixel electrodes provided on the first substrate and arranged in a matrix with rows and columns,
wherein each of the plurality of TFTs includes an oxide semiconductor layer supported by the first substrate, an insulating layer provided on the oxide semiconductor layer, a first electrode provided on the insulating layer, and a second electrode and a third electrode connected to the oxide semiconductor layer,
wherein the second electrode and the third electrode are made of an oxide conductive layer that is the same oxide semiconductor film as said oxide semiconductor layer, with a reduced resistance,
wherein each of the plurality of pixel electrodes is connected to the third electrode of a TFT corresponding thereto out of the plurality of TFTs, and is made of the oxide conductive layer,
wherein the first electrode of each of the plurality of TFTs corresponding to the pixel electrodes belonging to any row is connected to a common first bus line, the first electrode and the first bus line including a first conductive layer made of the same conductive film,
wherein the second electrode of each of the plurality of TFTs corresponding to the pixel electrodes belonging to any row is connected to a common second bus line, the second bus line including the oxide conductive layer,
wherein the first bus line includes the first electrode, the second bus line includes the second electrode, each of the pixel electrodes includes the third electrode,
wherein the second bus line includes a second conductive layer provided on the oxide conductive layer, the second conductive layer being made of the same conductive film as the first conductive layer, and
wherein when viewing the first substrate from a normal line direction, there is no gap between the first bus line and the pixel electrodes, and a gap between the first bus line and the second conductive layer of the second bus line is filled with the oxide conductive layer.

2. The semiconductor device according to claim 1, further comprising: a second substrate; and a plurality of signal electrodes supported by the second substrate,
wherein each of the plurality of signal electrodes is disposed facing pixel electrodes belonging to one of any column.

3. The display device according to claim 1, wherein the oxide semiconductor layer and the insulating layer are provided so as to be self-aligned with respect to the first electrode.

4. The semiconductor device according to claim 1,
wherein the semiconductor device further comprises a lead-out wiring line extending from the second electrode and connected to the first bus line of an adjacent row, and
wherein a common voltage is supplied to the second electrode from the first bus line in the adjacent row.

5. The semiconductor device according to claim 1, wherein the oxide semiconductor layer is an InGaZnO layer.

* * * * *